United States Patent
Seo

(10) Patent No.: US 7,550,357 B2
(45) Date of Patent: Jun. 23, 2009

(54) SEMICONDUCTOR DEVICE AND FABRICATING METHOD THEREOF

(75) Inventor: Eisuke Seo, Miyagi (JP)

(73) Assignee: Oki Semiconductor Co., Ltd., Tokyo (JP)

(*) Notice: Subject to any disclaimer, the term of this patent is extended or adjusted under 35 U.S.C. 154(b) by 24 days.

(21) Appl. No.: 11/707,940

(22) Filed: Feb. 20, 2007

(65) Prior Publication Data
US 2007/0210377 A1    Sep. 13, 2007

(30) Foreign Application Priority Data
Mar. 7, 2006 (JP) ............................ 2006-060623

(51) Int. Cl.
*H01L 21/8234* (2006.01)
(52) U.S. Cl. .................. 438/303; 438/527; 438/161; 438/217; 438/232; 438/257
(58) Field of Classification Search ................. 438/588, 438/216, 303, 304, 396, 592, 265, 286, 344
See application file for complete search history.

(56) References Cited

U.S. PATENT DOCUMENTS

| 5,545,578 | A * | 8/1996 | Park et al. ................... 438/303 |
| 5,989,967 | A * | 11/1999 | Gardner et al. .............. 438/305 |
| 6,060,733 | A * | 5/2000 | Gardner et al. .............. 257/283 |
| 6,362,033 | B1 * | 3/2002 | Lee et al. ..................... 438/182 |
| 6,544,873 | B1 * | 4/2003 | Yeom et al. .................. 438/588 |
| 7,064,021 | B2 * | 6/2006 | Chang ......................... 438/154 |
| 7,084,052 | B2 * | 8/2006 | Hirano et al. ............... 438/530 |
| 7,179,708 | B2 * | 2/2007 | Jeng et al. ................... 438/257 |
| 2002/0074550 | A1 * | 6/2002 | Itoga et al. .................... 257/72 |
| 2003/0211684 | A1 * | 11/2003 | Guo ........................... 438/230 |
| 2004/0053454 | A1 * | 3/2004 | Chen .......................... 438/163 |

FOREIGN PATENT DOCUMENTS

| JP | 3204939 | 9/1991 |
| JP | 05-267334 | 10/1993 |
| JP | 6333948 | 12/1995 |

* cited by examiner

*Primary Examiner*—Steven Loke
*Assistant Examiner*—David Goodwin
(74) *Attorney, Agent, or Firm*—Volentine & Whitt, P.L.L.C.

(57) ABSTRACT

A semiconductor device with a low drain current in the off-state of LDD type accommodating high voltages is provided. On the thermal oxide film, a polysilicon film and a CVD oxide film, and a resist pattern are formed, then the CVD oxide film is side-etched for formation of a CVD oxide film which is after the etching one-size smaller than the polysilicon film. Using the resist pattern as a mask, an impurity is implanted at a high concentration for formation of a source/drain region at a high concentration in an area which does not overlap with the polysilicon film. Further, the resist pattern is removed, and using the CVD oxide film as a mask, an impurity is implanted at a low concentration for formation of an LDD region of a low concentration in an area which overlaps with the gate electrode of the polysilicon film.

7 Claims, 3 Drawing Sheets

STEP1

STEP2

STEP3

STEP4

STEP5

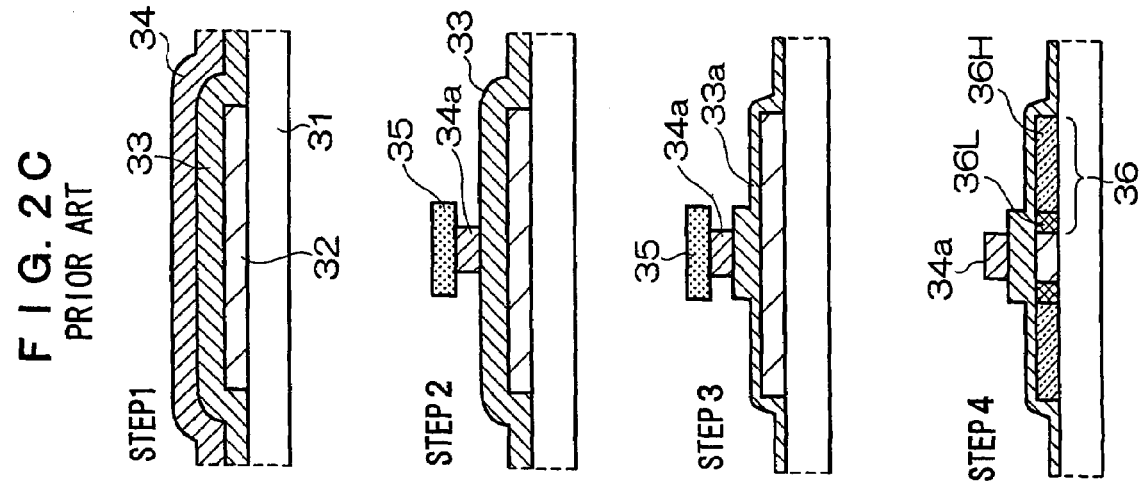

STEP1

STEP2

STEP3

STEP4

SEMICONDUCTOR DEVICE AND FABRICATING METHOD THEREOF

CROSS-REFERENCE TO RELATED APPLICATION

This application claims priority under 35 USC 119 from Japanese Patent Application No. 2006-060623, the disclosure of which is incorporated by reference herein.

BACKGROUND OF THE INVENTION

1. Field of the Invention

The present invention relates to a semiconductor device, and particularly to a semiconductor device with a high withstand-voltage transistor formed on a semiconductor substrate, and a fabricating method thereof.

2. Description of the Related Art

FIG. 2A to FIG. 2C are fabrication process drawings for the conventional semiconductor devices as stated in Japanese Patent Laid-Open Publication No. 3-204939, Patent Laid-Open Publication No. 5-267334, and Japanese Patent Laid-Open Publication No. 6-333948. Any of these illustrates a fabricating method for a transistor of an LDD (Lightly Doped Drain) structure in which the low concentration impurity region is given on the gate electrode side in the source/drain region. The transistor of LDD structure features that the width of a depletion layer formed between the channel region and the source/drain region is increased for decreasing the potential gradient and lowering the drain current in the off-state.

FIG. 2A is a figure as given in Japanese Patent Laid-Open Publication No. 3-204939. At step 1, a gate oxide film 12 and a polysilicon layer 13 are formed on a p-type silicon substrate 11, and on this polysilicon layer 13, a natural oxide film 14 is formed, then a high melting-point metal layer 15, such as tungsten, or the like, is deposited, and a pattern of a photoresist 19 is formed. Next, the photoresist 19 and the natural oxide film 14 are used as a mask and an etching stopper, respectively, to anisotropically etch the high melting-point metal layer 15 for formation of a second gate electrode 15a made of a high melting-point metal.

At step 2, the photoresist 19 is removed, and a low concentration of an n-type impurity is implanted into the p-type silicon substrate 11, using the gate electrode 15a as a mask, to form an n-diffusion layer 17. Further, over the entire surfaces of the natural oxide film 14 and the gate electrode 15a, a silicon oxide film 16 is deposited.

At step 3, the silicon oxide film 16 is etched back, forming a side wall 16a made of an oxide film. By this etchback, the natural oxide film 14 is also etched off except for the portion thereof that is adjacent to the gate electrode 15a and the oxide film side wall 16a. Thereafter, the polysilicon layer 13 is etched, using the gate electrode 15a and the oxide film side wall 16a as a mask, to form a first gate electrode 13a made of polysilicon.

At step 4, using the second gate electrode 15a, the oxide film side wall 16a, and the first gate electrode 13a as a mask, a high concentration of an n-type impurity is implanted into the n-diffusion layer 17 to form an n+ diffusion layer 18. This n+ diffusion layer 18 provides source/drain regions for the transistor. Thereafter, application of a heat treatment will cause the high melting-point metal in the second gate electrode 15a to be thermally diffused into the natural oxide film 14, resulting in the first gate electrode 13a and the second gate electrode 15a being electrically connected to each other.

FIG. 2B is a figure as given in Japanese Patent Laid-Open Publication No. 5-267334. At step 1, on the main surface of a p-type silicon substrate 21, the LOCOS (Local Oxidation of Silicon) method is used to form a field oxide film 22 in an element isolation region, and a gate oxide film 23 in the element formation region. Next, on the surfaces of the field oxide film 22 and the gate oxide film 23, a polysilicon film 24 and a natural oxide film 25 are sequentially formed. Further, on the surface of the natural oxide film 25, an n-type polysilicon layer, which provides a gate electrode constituting material, is deposited, and this polysilicon layer is dry etched by photolithography for forming a second polysilicon film 26. In this dry etching, the natural oxide film 25 serves as an etching stopper. In this state, using the second polysilicon film 26 as a mask, a low concentration of an n-type impurity is implanted into the p-type silicon substrate 21 to form an n-type low concentration layer 27.

At step 2, a silicon nitride film is deposited, and this silicon nitride film is etched to form a first side wall 28a on the side face of the second polysilicon film 26. Further, using the polysilicon film 26 and the side wall 28a as a mask, the natural oxide film 25 and the polysilicon film 24 are sequentially dry etched. Thereby, a natural oxide film 25a and a polysilicon film 24a which provide a gate electrode are formed.

At step 3, after selectively removing the first side wall 28a, a silicon dioxide film is deposited, and this silicon dioxide film is etched to form a second side wall 29.

At step 4, a high concentration of an n-type impurity is implanted into the n-type low concentration layer 27 to form an n-type high concentration layer 30, which provides source/drain regions.

FIG. 2C is a figure as given in Japanese Patent Laid-Open Publication No. 6-333948. At step 1, a semiconductor thin film 32 made of silicon, or the like, is formed on an insulation substrate 31, on the surface thereof, a gate oxide film 33 is formed, and further on the surface thereof, a gate electrode film 34 for formation of a gate electrode is formed.

At step 2, using a resist film 35 as a mask, the gate electrode film 34 is dry etched to form a gate electrode 34a. At this time, the width of the gate electrode 34a is made narrower than that of the resist film 35 by side etching.

At step 3, using the resist film 35 as a mask, the gate insulation film 33 is partially anisotropically etched to form a shoulder part in a location which provides a broader width than that of the gate electrode 34a. Thereby, a gate insulation film 33a is formed which is different in film thickness, the area under the gate electrode 34a being made thicker, while the area other than that being made thinner.

At step 4, after removing the resist film 35, an impurity is implanted into the semiconductor thin film 32 to form source/drain regions 36. The amount of implantation of the impurity depends upon the film thickness of the gate insulation film, resulting in the portion closer to the gate electrode 34a providing a low concentration layer 36L which is low in impurity concentration, while the portion further away from the gate electrode 35a providing a high concentration layer 36H which is high in impurity concentration, thus an LDD structure can be obtained.

However, with the transistors as stated in the above three literatures, the amount of overlap between the low concentration layer and the gate electrode is small, thus there has been a problem that the capability of the low concentration layer as an electric field relaxation layer for enhancing the hot-carrier resistance is low, which makes it difficult for such transistors to accommodate high voltages.

SUMMARY OF THE INVENTION

The present invention has been made in view of the above situation, and the purpose thereof is to provide a semiconductor device with which the drain current in the off-state is low, and which can accommodate high voltages.

The semiconductor device of the present invention provides a semiconductor device comprising an insulation film which is formed in the active region of a semiconductor substrate; a gate electrode which is formed in a predetermined location on said insulation film; an oxide film which is formed on the gate electrode such that the outer edge of the oxide film is located inside by a definite dimension of said gate electrode; a first diffusion layer which is formed by diffusing a high concentration of an impurity in said active region excluding the area which overlaps with said gate electrode; and a second diffusion layer which is formed by diffusing a low concentration of an impurity in said active region in the area which overlaps with said gate electrode, but does not overlap with said oxide film.

In the present invention, a second diffusion layer (LDD) is formed by diffusing a low concentration of an impurity in the active region in the area which overlaps with the gate electrode, but does not overlap with the oxide film. Thereby, as a transistor of an LDD structure, the drain current in the off-state can be reduced. Further, the gate electrode and the LDD overlap with each other, thus there is an effect that this LDD effectively acts as an electric field relaxation layer, resulting in the hot-carrier resistance being improved to allow high voltages to be accommodated.

BRIEF DESCRIPTION OF THE DRAWINGS

Preferred exemplary embodiments of the present invention will be described in detail based on the following figures, wherein:

FIG. 2A is a fabrication process drawing for a conventional semiconductor device;

FIG. 2B is a fabrication process drawing for a conventional semiconductor device;

FIG. 2C is a fabrication process drawing for a conventional semiconductor device;

DETAILED DESCRIPTION OF THE INVENTION

Hereinbelow, exemplary embodiments of the present invention will be described with reference to the drawings.

On the circuit forming face of a semiconductor substrate, a field oxide film and an insulation film are selectively formed, and on the surface thereof, a gate electrode film and an oxide film are sequentially formed. In addition, on the oxide film, a resist pattern is formed, and using it as a mask, the oxide film and the gate electrode film are etched for forming a gate electrode.

Next, using the resist pattern as a mask, the wall face of the oxide film is etched off by a definite dimension, then, using this resist pattern as a mask, ion implantation into the circuit forming surface of the semiconductor substrate is performed for forming a high concentration of a first diffusion layer. Thereafter, the resist pattern is removed, and using the oxide film as a mask, ion implantation into the semiconductor substrate is performed for forming a low concentration of a second diffusion layer.

The above and other purposes and novel features of the present invention will be more thoroughly clarified, if the description of the following preferred exemplary embodiments is read with reference to the attached drawings. However, the drawings are only for explanation, and are not for limiting the scope of the present invention.

Exemplary Embodiment 1

FIG. 1A to FIG. 1E are fabrication process drawings for a semiconductor device representing exemplary embodiment 1 of the present invention. Hereinbelow, the present exemplary embodiment will be described with reference to these FIG. 1A to FIG. 1E.

Figure 1A:
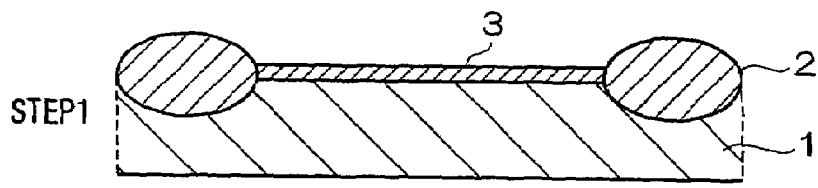
FIG. 1A is a fabrication process drawing for a semiconductor device representing exemplary embodiment 1 of the present invention.
Figure 1B:
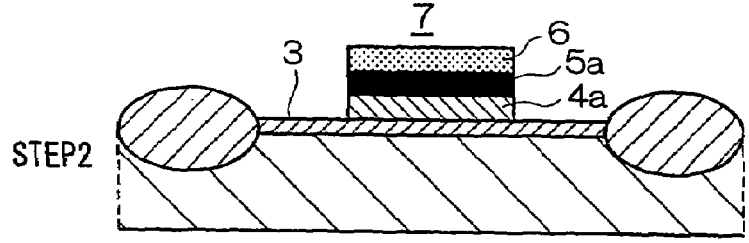
FIG. 1B is a fabrication process drawing for the semiconductor device representing exemplary embodiment 1 of the present invention.
Figure 1C:
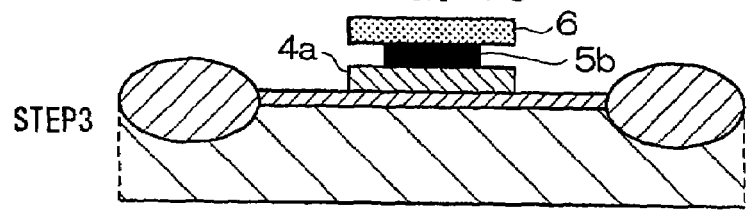
FIG. 1C is a fabrication process drawing for the semiconductor device representing exemplary embodiment 1 of the present invention.
Figure 1D:
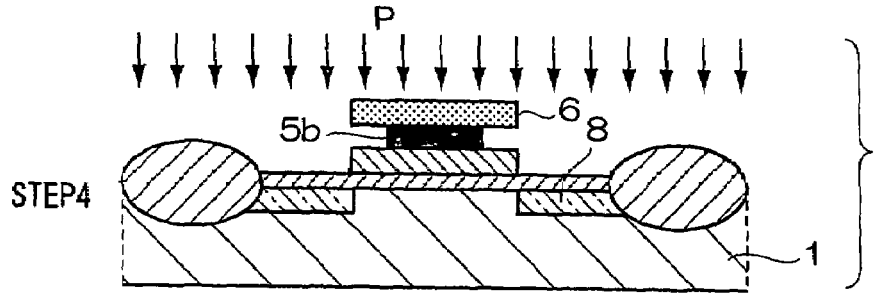
FIG. 1D is a fabrication process drawing for the semiconductor device representing exemplary embodiment 1 of the present invention.
Figure 1E:
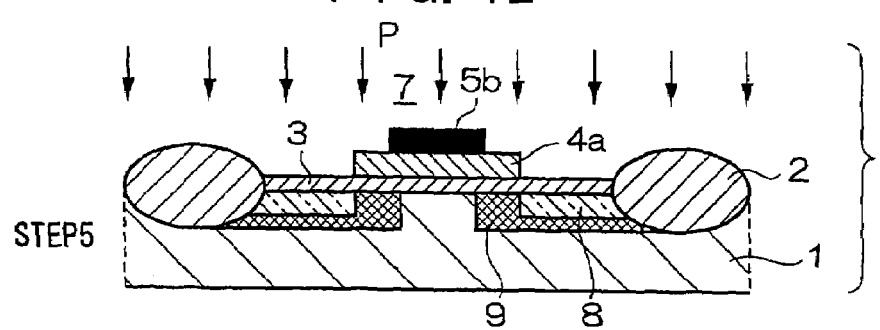
FIG. 1E is a fabrication process drawing for the semiconductor device representing exemplary embodiment 1 of the present invention.

As shown in FIG. 1E, this semiconductor device (a transistor) comprises an insulation film (for example, a thermal oxide film 3) which is formed in an active region of a semiconductor substrate (for example, a silicon substrate 1); a gate electrode (for example, a polysilicon film 4a) which is formed in a predetermined location on this insulation film; and an oxide film (for example, a CVD (Chemical Vapor Deposition) oxide film 5b) which is formed such that the outer edge of the oxide film is located inside by a definite dimension of this gate electrode. Further, this semiconductor device comprises a first diffusion layer (for example, a source/drain region 8) which is formed by diffusing a high concentration of an impurity in the active region excluding the area which overlaps with the gate electrode; and a second diffusion layer (for example, an LDD region 9) which is formed by diffusing a low concentration of an impurity in the area in the active region that overlaps with the gate electrode, but does not overlap with the oxide film.

This semiconductor device can be fabricated by the following steps.

At step 1 (FIG. 1A), on the circuit forming face of a p-type silicon substrate 1, a field oxide film 2 with a film thickness of 600 to 1000 nm is formed in the element isolation region, using the conventional LOCOS method. In addition, in the active region, a thermal oxide film 3 of 50 nm or so is formed in an atmosphere of dried oxygen at 700 to 900 deg.

At step 2 (FIG. 1B), over the entire surface of the field oxide film 2 and the thermal oxide film 3, a polysilicon film is deposited to a thickness of 150 nm, for example, and then a CVD oxide film is deposited to a thickness of 100 nm, for example, which is followed by forming a resist pattern 6, using the well-known photolithography etching technology. Further, using the resist pattern 6 as a mask, and the thermal oxide film 3 as an etching stopper, the CVD oxide film and the polysilicon film are dry etched to form a gate electrode 7 made up of the CVD oxide film 5a and the polysilicon film 4a which have been left. At this point of time, the resist pattern 6 is not removed, being left as it is.

At step 3 (FIG. 1C), using the resist pattern 6 as a mask, only the CVD oxide film 5a is side etched by wet etching with an HF (hydrogen fluoride)-based etchant, for example. Hererin, the etching amount of the wall face of the CVD oxide film 5b is adjusted so as to be about 300 to 400 nm.

Thereby, a visor-like structure in which the outer edge part of the resist pattern 6 overhangs like a visor above the CVD oxide film 5b which wall face has been etched off is formed. For such etching, dry etching using, for example, a CxFy (carbon fluoride)-based gas which is high in etching selectivity ratio of oxide to silicon can be used besides the wet etching.

At step 4 (FIG. 1D), using the resist pattern 6 as a mask, first-time ion implantation is performed at a high concentration. In this ion implantation, phosphorous is implanted at a high concentration as of about $10^{15}$ ions/cm$^2$ with a low amount of energy of about 30 to 50 keV, for example, to form source/drain regions 8. At this time, no ions are implanted into the region of the silicon substrate 1 which is covered with the resist pattern 6.

At step 5 (FIG. 1E), after removing the resist pattern 6, second-time ion implantation is performed using the CVD oxide film 5b as a mask. In this ion implantation, phosphorous is implanted at a concentration as low as $10^{13}$ ions/cm$^2$ with an amount of energy as high as 100 keV, for example, to form an LDD region 9.

As described above, in this semiconductor device of exemplary embodiment 1, an LDD region 9 where a low concentration of an impurity is diffused is formed in the active region in the area which overlaps with the gate electrode 7 (polysilicon film 4a), but does not overlap with the thermal oxide film 3. Thereby, as a transistor of an LDD structure, the drain current in the off-state can be reduced, and because the gate electrode 7 and the LDD region 9 overlap with each other, this LDD region 9 effectively acts as an electric field relaxation layer, which offers an advantage that the hot-carrier resistance is improved, resulting in high voltages being able to be accommodated.

Exemplary Embodiment 2

FIG. 3A to FIG. 3D are fabrication process drawings for a semiconductor device representing exemplary embodiment 2 of the present invention, and the elements common to the elements in FIG. A to FIG. 1E are provided with common numerals and signs. Hereinbelow, the present exemplary embodiment will be described with reference to these FIG. 3A to FIG. 3D.

Figure 3A:
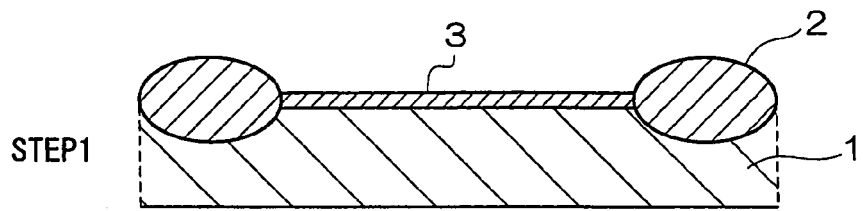
FIG. 3A is a fabrication process drawing for a semiconductor device representing exemplary embodiment 2 of the present invention.
Figure 3B:
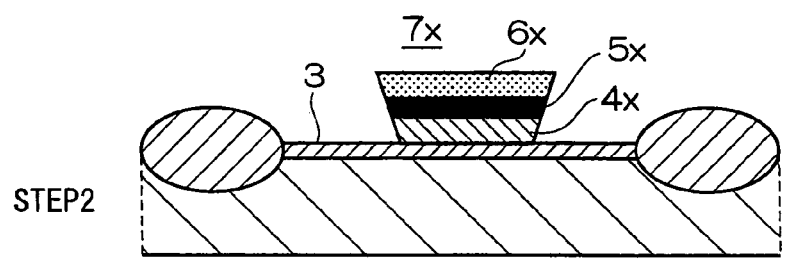
FIG. 3B is a fabrication process drawing for the semiconductor device representing exemplary embodiment 2 of the present invention.
Figure 3C:
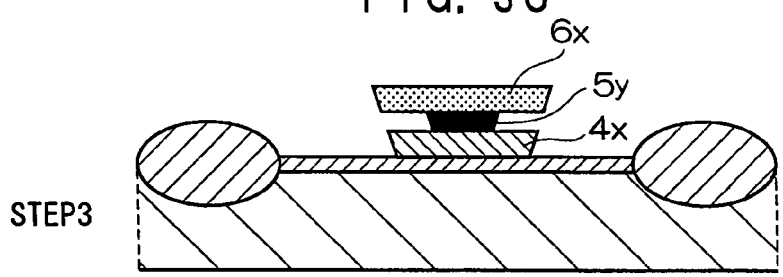
FIG. 3C is a fabrication process drawing for the semiconductor device representing exemplary embodiment 2 of the present invention.
Figure 3D:
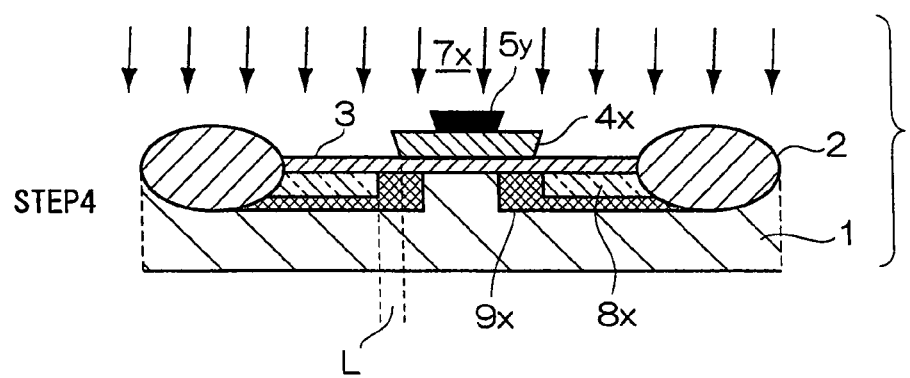
FIG. 3D is a fabrication process drawing for the semiconductor device representing exemplary embodiment 2 of the present invention.

This semiconductor device comprises a thermal oxide film 3 which is formed in the active region of a silicon substrate 1 as shown in FIG. 3D; a gate electrode 7x made up of a polysilicon film 4x that is formed in a predetermined location on this thermal oxide film 3; a CVD oxide film 5y which is formed such that the outer edge of the oxide film is located inside by a definite dimension of this gate electrode 7x; source/drain regions 8x which are formed by diffusing a high concentration of an impurity in the active region excluding the area which overlaps with the gate electrode 7x; and an LDD region 9x which is formed by diffusing a low concentration of an impurity in the area in the active region that overlaps with the gate electrode 7x, but does not overlap with the thermal oxide film 3 in the active region. The difference from the semiconductor device as shown in FIG. 1E lies in that the polysilicon film 4x and the CVD oxide film 5y which constitute the gate electrode 7x have a trapezoid section which is narrowed down toward the silicon substrate 1 side.

This semiconductor device can be fabricated by the following steps.

The step 1 (FIG. 3A) is the same as the step 1 (FIG. 1A) in exemplary embodiment 1.

At step 2 (FIG. 3B), in the same manner as that for step 2 (FIG. 1B) in exemplary embodiment 1, a polysilicon film is generated over the entire surface of the field oxide film 2 and the thermal oxide film 3, and then a CVD oxide film is deposited, which is followed by forming a resist pattern 6x. Further, using the resist pattern 6x as a mask, and the thermal oxide film 3 as an etching stopper, the CVD oxide film and the polysilicon film are dry etched to form a gate electrode 7x made up of the remaining CVD oxide film 5x and the remaining polysilicon film 4x.

At this time, also after the polysilicon film excluding that for the gate electrode 7x having been removed, the etching is continued until the gate electrode 7x on the silicon substrate 1 side is narrowed down by overetching. Thereby, the angle formed between the wall face of the gate electrode 7x and the silicon substrate 1 surface is 60 to 80 deg with a tapered geometry being provided. At this point of time, the resist pattern 6x is not removed, being left as it is.

At step 3 (FIG. 3C), using the resist pattern 6x as a mask, only the CVD oxide film 5x is side etched. Hererin, the etching amount of the wall face of the CVD oxide film 5x is adjusted so as to be about 300 to 400 nm. Thereby, a visor-like structure in which the outer edge part of the resist pattern 6x overhangs like a visor above the CVD oxide film 5y which wall face has been etched off is formed.

At step 4 (FIG. 3D), using the resist pattern 6x as a mask, first-time ion implantation is performed at a high concentration, and further, after removing the resist pattern 6x, second-time ion implantation is performed using the CVD oxide film 5y as a mask. Thereby, for the source/drain regions 8x with a high concentration, an offset L is formed with respect to the bottom end of the gate electrode 7x (polysilicon film 4x).

As described above, with this semiconductor device of exemplary embodiment 2, in addition to the same advantage as that in exemplary embodiment 1, an advantage that the offset L is formed between the source/drain region 8x and the gate electrode 7x, thus the hot-carrier resistance is further improved, as compared to that for the semiconductor device of exemplary embodiment 1, resulting in high voltages being able to be still better accommodated.

The present invention is not limited to the above-stated exemplary embodiments, but is capable of providing various modifications. As such modifications, the following ones are available for example.

(a) The p-type silicon substrate 1 is used, however, the present invention is also applicable to an n-type silicon substrate as well.

(b) The materials, the dimensions and the treatment methods are not limited to those exemplified.

(c) At the time of generation of the gate electrode 7, 7x, the thermal oxide film 3 was used as an etching stopper, however, the present invention may be adapted such that this thermal oxide film 3 is also removed by etching.

What is claimed is:

1. A fabricating method for a semiconductor device comprising:

selectively forming a field oxide film and an insulation film on a circuit forming surface of a semiconductor substrate;

sequentially forming a gate electrode film and then an oxide film on a surface of said field oxide film and the insulation film;

forming a resist pattern having a predetermined geometry on said oxide film by photolithography;

using said resist pattern as a mask, etching said oxide film and said gate electrode film to form a gate electrode;

using said resist pattern as a mask, etching off a wall face of said oxide film by a predetermined dimension;

using said resist pattern as a mask, performing ion implantation into the circuit forming surface of said semiconductor substrate to form a first diffusion layer of a high concentration; and removing said resist pattern, and using said oxide film as a mask, performing ion implantation into the circuit forming surface of said semiconductor substrate to form a second diffusion layer of a low concentration.

2. The fabricating method for a semiconductor device of claim 1, wherein, in the process using said resist pattern as a mask to etch said oxide film and said gate electrode film, to form a gate electrode, a side wall of the gate electrode is tapered such that a bottom face of said gate electrode formed is made smaller in area than said resist pattern.

3. A fabricating method for a semiconductor device comprising:

(a) on a circuit forming face of a silicon substrate, forming a field oxide film in an element isolation region;

(b) in an active region of the circuit forming face, forming a thermal oxide film;

(c) generating a polysilicon film over an entire surface of said field oxide film and the thermal oxide film;

(d) depositing a CVD oxide film over the polysilicon film;

(e) forming a resist layer and using photolithography etching technology on the resist layer to form a resist pattern;

(f) by using said resist pattern as a mask, and said thermal oxide film as an etching stopper, dry etching said CVD oxide film and said polysilicon film to form a gate electrode comprising the CVD oxide film and the polysilicon film remaining after the dry etching;

(g) by using said resist pattern as a mask, side etching only said remaining CVD oxide film;

(h) by using said resist pattern as a mask, performing a first ion implantation at a high concentration, to form source/drain regions; and (i) after removing said resist pattern, by using said CVD oxide film as a mask, performing a second ion implantation at a low concentration to form an LDD region.

4. The fabricating method for a semiconductor device of claim 3, wherein the side etching in said (g) is performed by a wet etching process which provides a high etching selectivity ratio between oxide and silicon.

5. The fabricating method for a semiconductor device of claim 3, wherein the side etching in said (g) is performed by a dry etching process which provides a high etching selectivity ratio between oxide and silicon.

6. The fabricating method for a semiconductor device of claim 3, wherein, in said first ion implantation in said (h), phosphorous is implanted at a high concentration of about $10^{15}$ ions/cm$^2$ with a low amount of energy of about 30 to 50 keV, and said silicon substrate is p-type.

7. The fabricating method for semiconductor device of claim 3, wherein, in said second ion implantation in said (i), phosphorous is implanted at a low concentration of about $10^{13}$ ions/cm$^2$ with a high amount of energy of about 100 keV, and said silicon substrate is p-type.

* * * * *